(12) United States Patent
Bergbauer et al.

(10) Patent No.: US 8,884,311 B2
(45) Date of Patent: Nov. 11, 2014

(54) OPTOELECTRONIC SEMICONDUCTOR CHIP AND METHOD FOR PRODUCING SAME

(75) Inventors: Werner Bergbauer, Windberg (DE); Lutz Höppel, Alteglofsheim (DE); Philipp Drechsel, Mintraching (DE); Christopher Kölper, Regensburg (DE); Martin Straßburg, Donaustauf (DE); Patrick Rode, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/696,602

(22) PCT Filed: Apr. 29, 2011

(86) PCT No.: PCT/DE2011/001025
§ 371 (c)(1),
(2), (4) Date: Dec. 26, 2012

(87) PCT Pub. No.: WO2011/144199
PCT Pub. Date: Nov. 24, 2011

(65) Prior Publication Data
US 2013/0193450 A1    Aug. 1, 2013

(30) Foreign Application Priority Data
May 18, 2010    (DE) .................. 10 2010 020 789

(51) Int. Cl.

| H01L 31/02 | (2006.01) |
|---|---|
| H01L 31/18 | (2006.01) |
| H01L 31/0236 | (2006.01) |
| H01L 33/02 | (2010.01) |
| H01L 33/22 | (2010.01) |
| H01L 31/0232 | (2014.01) |
| H01L 33/12 | (2010.01) |
| H01L 33/00 | (2010.01) |
| H01L 33/24 | (2010.01) |

(52) U.S. Cl.
CPC ............... *H01L 33/02* (2013.01); *H01L 31/18* (2013.01); *H01L 31/02363* (2013.01); *H01L 33/12* (2013.01); *H01L 31/02* (2013.01); *H01L 33/22* (2013.01); *H01L 33/0079* (2013.01); *H01L 33/24* (2013.01); *Y02E 10/50* (2013.01); *H01L 31/02327* (2013.01)
USPC .......................................................... 257/79

(58) Field of Classification Search
USPC .......................................................... 257/79
See application file for complete search history.

(56) References Cited

U.S. PATENT DOCUMENTS

| 2003/0057444 A1 | 3/2003 | Niki et al. |
|---|---|---|
| 2004/0119082 A1 | 6/2004 | Sugawara |
| 2008/0035953 A1* | 2/2008 | Beom et al. .................. 257/103 |
| 2008/0073655 A1 | 3/2008 | Albrecht et al. |

FOREIGN PATENT DOCUMENTS

| DE | 10 2006 043 400 A1 | 3/2008 |
|---|---|---|
| EP | 1 855 327 A2 | 11/2007 |
| WO | 2009/116018 A2 | 9/2009 |

* cited by examiner

*Primary Examiner* — Thao P Le
(74) *Attorney, Agent, or Firm* — DLA Piper LLP (US)

(57) ABSTRACT

An optoelectronic semiconductor chip includes a semiconductor layer stack and a radiation exit face or radiation entrance face, wherein the semiconductor layer stack includes an active layer that generates or receives electromagnetic radiation, and a plurality of nanostructures arranged in the semiconductor layer stack and/or on the radiation exit or entrance face, at least some of the nanostructures including at least one substructure.

12 Claims, 3 Drawing Sheets

41

42

42

41

42

42

OPTOELECTRONIC SEMICONDUCTOR CHIP AND METHOD FOR PRODUCING SAME

RELATED APPLICATIONS

This is a §371 of International Application No. PCT/DE2011/001025, with an international filing date of Apr. 29, 2011 (WO 2011/144199 A1, published Nov. 24, 2011), which claims priority from German Patent Application No. 10 2010 020 789.6, filed May 18, 2010, the subject matter of which is incorporated herein by reference.

TECHNICAL FIELD

This disclosure relates to an optoelectronic semiconductor chip comprising a semiconductor layer stack and a radiation exit or radiation entrance face and a method for the production thereof.

BACKGROUND

The performance of radiation-emitting semiconductor chips such as, for example, LEDs or radiation-receiving semiconductor chips such as, for example, sensors or detectors, is influenced inter alia by the use of a substrate on which the semiconductor layers of the semiconductor chip are grown. Compared with the semiconductor layers of the semiconductor chip, the substrate generally exhibits significant differences with regard to coefficient of expansion and/or lattice parameters in particular. This may cause lattice dislocations and point defects to arise, which result in non-emitting or non-receiving recombination centers, so disadvantageously affecting the internal and external quantum efficiency of the semiconductor chip. In addition, leakage current paths may arise in the semiconductor chip.

To improve light outcoupling out of the semiconductor chip or light coupling into it, it is known to keep the angle of the incident radiation at the boundary surface between semiconductor chip and surrounding environment smaller than the critical angle of the total reflection. To this end, the surface of the semiconductor chip is treated using a wet chemical etching process, for example, using KOH (potassium hydroxide), whereby specific three-dimensional structures may be formed on the surface, which however do not lead to maximum, angle-independent radiation emission due to the selective chemical reaction.

To optimize radiation emission of the semiconductor chip, surface structures which exhibit a specific shape and size are advantageous. With the conventional production method used to produce surface structures such as, for example, KOH treatment of the surface, limits are set to the shape and size of the surface structures, however.

It could therefore be helpful to provide a semiconductor chip which exhibits reduced lattice dislocations and/or point defects, so resulting advantageously in improved semiconductor chip efficiency and to provide an improved production method for such a semiconductor chip.

SUMMARY

We provide an optoelectronic semiconductor chip including a semiconductor layer stack and a radiation exit or entrance face, wherein the semiconductor layer stack includes an active layer that generates or receives electromagnetic radiation, and a plurality of nanostructures arranged in the semiconductor layer stack and/or on the radiation exit or entrance face, at least some of the nanostructures including at least one substructure.

We also provide an optoelectronic semiconductor chip including a semiconductor layer stack and a radiation exit face, wherein the semiconductor layer stack includes an active layer that generates electromagnetic radiation, a plurality of nanostructures arranged on the radiation exit face, at least some of the nanostructures including at least one substructure, the nanostructures each extend laterally by at most 5 µm, the nanostructures are produced by metal organic vapor phase epitaxy, molecular beam epitaxy or liquid phase epitaxy, shape and size of the nanostructures and substructures being established by the method, the nanostructures include vertical flanks, and the nanostructures are pyramidal or rod-shaped.

We further provide a method of producing an optoelectronic semiconductor chip including forming a semiconductor layer stack including an active layer that generates or receives electromagnetic radiation, forming nanostructures on the semiconductor layer stack or in the semiconductor layer stack, and forming at least one substructure in at least some of the nanostructures.

DETAILED DESCRIPTION

Figure 1A:
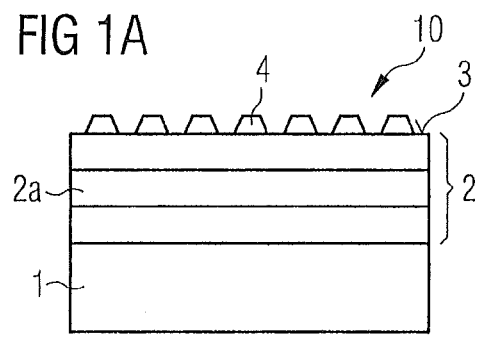
FIGS. 1A to 1C show schematic cross sections of semiconductor chips according to a plurality of examples.

The optoelectronic semiconductor chip may comprise a semiconductor layer stack and a radiation exit or entrance face. The semiconductor layer stack comprises an active layer that generates or receives electromagnetic radiation. A plurality of nanostructures is arranged on the radiation exit face or radiation entrance face, at least some of the nanostructures comprising at least one substructure. Alternatively or in addition, a plurality of nanostructures, at least some of which comprise at least one substructure, are arranged in the semiconductor layer stack.

It is not absolutely essential for each nanostructure of the radiation exit or radiation entrance face and/or in the semiconductor layer stack to comprise a substructure. It is additionally possible for a nanostructure to comprise a plurality of substructures. The substructures may be arranged purposefully or randomly in the nanostructures. The shape and size of the substructures is preferably dependent on the desired optoelectronic and chemical properties of the semiconductor layer stack.

The surface area of the nanostructures is preferably enlarged by the substructures in the nanostructures, as compared with nanostructures without integral substructures. In addition, the disadvantageous consequences which may arise from lattice dislocations and point defects, may be reduced since there is an indirect proportionality between the effects of lattice dislocations or point defects and surface area. For example, dislocations or defects may cancel each other out as a result of the increased surface area. Due to the increased surface area, the number of non-emitting or non-receiving recombination centers may be reduced, so advantageously improving the internal and external quantum efficiency of the semiconductor chip. Leakage current paths in the semiconductor chip, which may arise as a result of lattice dislocations or point defects, may thus additionally be reduced. Altogether, the dislocation density of the layers in the semiconductor chip may advantageously be significantly reduced.

By using nanostructures with integral substructures, it is advantageously possible to use a growth substrate with a coefficient of expansion which differs from the coefficient of expansion of the semiconductor layers. In particular, non-crystalline surfaces such as, for example, amorphous surfaces may in this way be used. In addition, detachment of the substrate during the semiconductor chip production process is simplified.

An optoelectronic semiconductor chip is in particular a semiconductor chip which allows the conversion of electronically generated data or energy into light emission or vice versa. The optoelectronic semiconductor chip is, for example, a radiation-emitting or radiation-receiving semiconductor chip.

The at least one substructure may be a recess, for example, a well, a hole, a channel or an orifice at a nanostructure surface or within a nanostructure. In addition, the at least one substructure may also be a raised portion, for example, a web or a bulge. The substructure is then preferably configured in accordance with the electro-optical and chemical properties of the semiconductor layer stack.

The nanostructures may be arranged in a periodic pattern. The nanostructures are preferably formed in this periodic pattern during a growth process. If the plurality of nanostructures are arranged on the radiation exit face or radiation entrance face, the radiation exit face or radiation entrance face thus comprises a regular pattern of nanostructures. In this way, angle-independent radiation emission may advantageously be achieved, so advantageously resulting in a homogeneous emission pattern.

The periodic arrangement of the nanostructures on the radiation exit face or radiation entrance face may be purposefully arranged such that radiation shaping is produced. No complex post-machining steps are advantageously needed with regard to shaping the nanostructures as a function of the desired radiation shape.

If the plurality of nanostructures is alternatively or additionally arranged in the semiconductor layer stack, this means that at least one layer of the semiconductor layer stack may comprise the nanostructures. For example, the semiconductor layer stack with the active layer may be arranged on a substrate, for example, a growth or carrier substrate, wherein the nanostructures may be arranged between the substrate and the active layer such that the active layer is in turn arranged between the nanostructures and the radiation exit or entrance face. In this way, a reduction in defects in the active layer may advantageously be achieved.

Alternatively, the active layer may also be arranged in the nanostructures. This may mean in particular that the semiconductor layer stack or a part thereof, including the active layer, may take the form of a plurality of nanostructures. The surface areas of the nanostructures may advantageously be enlarged by the substructures in the nanostructures such that lattice defects which may occur in the nanostructures extend along the enlarged surface areas and thus a reduction in lattice defects in the active layer may advantageously be achieved within the nanostructures. Furthermore, in a nanostructure with an active layer, the active layer may also advantageously be enlarged by the substructure.

If the nanostructures are arranged in the semiconductor layer stack, they may, for example, be grown on a buffer layer or fused with a buffer layer. Alternatively, the nanostructures may also be grown directly on or applied directly to a substrate without a buffer layer being present between the substrate and the nanostructures. Furthermore, one or more layers of the semiconductor layer stack may also be grown over the nanostructures or fused with the nanostructures.

The nanostructures in each case may extend laterally by at most 5 μm. Particularly preferably, the nanostructures in each case extend laterally by at most 2 μm or even by at most 1 μm.

The nanostructures are preferably of minimal dimensions, wherein at the same time preferably virtually true vertical nanostructure flanks are achieved. To this end, the nanostructures are preferably grown during formation of the semiconductor layer stack and/or onto the radiation exit or entrance face.

The nanostructures may comprise a plurality of substructures which preferably exhibit different sizes and/or shapes. In this respect, the nanostructures may each comprise a substructure, wherein the size and/or shape of the substructures may vary between individual nanostructures. In addition or alternatively, a nanostructure may comprise a plurality of substructures, wherein the substructures of one nanostructure may exhibit different sizes and/or shapes from one another.

The semiconductor chip may be a thin film chip. A semiconductor chip is regarded as a thin film chip if, during production thereof, the growth substrate on which the semiconductor layer stack was grown epitaxially, for example, is preferably completely detached.

The nanostructures are three-dimensional structures. In other words, the nanostructures occupy three spatial dimensions. For example, the nanostructures are pyramidal or rod-shaped.

The semiconductor chip may be an LED (light-emitting diode) or a sensor. For instance, the semiconductor chip may, for example, be an LED or a sensor which comprises nanostructures of rod-shaped construction. Alternatively or in addition, the semiconductor chip may also, for example, comprise pyramidal nanostructures as explained below.

The semiconductor chip is preferably based on a nitride compound semiconductor, phosphide compound semiconductor and/or arsenide compound semiconductor. This means that the active epitaxial layer sequence or at least one layer thereof comprises a nitride, phosphide and/or arsenide III-V compound material. The compound material may comprise one or more dopants and additional constituents which do not substantially modify the characteristic physical properties of the compound material.

The semiconductor layer stack is preferably based on the material system AlInGaN.

The nanostructures may be arranged in a regular pattern on the radiation exit or entrance face and are of pyramidal construction. The nanostructures each comprise at least one substructure which is a recess and arranged in the center of the pyramid. The pyramid thus does not comprise an apex. A substructure is arranged in place of the apex, the substructure in particular taking the form of a recess. This may advantageously improve the efficiency of the semiconductor chip since lattice dislocations and/or point defects which may occur may be countered as a result of the enlarged surface area.

A method of producing an optoelectronic semiconductor chip comprises the following steps:

- forming a semiconductor layer stack which comprises an active layer suitable for generating or receiving electromagnetic radiation,
- forming nanostructures on the semiconductor layer stack or in the semiconductor layer stack, and
- forming at least one substructure in at least some of the nanostructures.

Formation of the nanostructures may in particular proceed at the same time as formation of the at least one substructure in at least some of the nanostructures. Once the nanostructures have been formed in the semiconductor layer stack, formation of the semiconductor layer stack may proceed simultaneously with formation of the nanostructures and formation of the at least one substructure in at least some of the nanostructures.

The features mentioned in relation to the optoelectronic semiconductor chip also apply for the method and vice versa.

The production method accordingly does not include just production of nanostructures on a radiation exit or entrance face of the semiconductor chip to improve radiation outcoupling or indeed in the semiconductor layer stack. In addition, substructures are formed in the nanostructures, which advantageously increase the surface area of the nanostructures such that the effects resulting from any lattice dislocations or point defects present may be countered.

The surface area of the nanostructure may be enlarged by the substructure, whereby any lattice dislocations and defects arising may advantageously be effectively countered.

The nanostructures may be produced by MOCVD (metal organic vapor phase epitaxy). Periodically arranged nanostructures may preferably be achieved using such a production method, wherein using this method nanostructures of minimal dimensions may be formed, and at the same time virtually vertical nanostructure side faces may be achieved. In addition, specifically desired nanostructure side ratios may be purposefully established and monitored. Post-machining processes for precise realization of the desired or specific shape and size of the nanostructures are thus unnecessary. Using such a method, the shape and size of the nanostructures and substructures are preferably established as a function of the optoelectronic and chemical properties of the semiconductor layer stack, whereby optimized and angle-independent radiation emission or detection may, for example, advantageously be achieved for the semiconductor chip.

As an alternative to a production method based on MOCVD, the nanostructures may also be produced using MBE (molecular beam epitaxy) or LPE (liquid phase epitaxy).

Growth substrate in which the semiconductor layer stack has been grown may be detached at least partially or completely.

Further advantages are revealed by the examples described below in conjunction with FIGS. 1A to 4B.

In the figures, identical or identically acting components may in each case be provided with the same reference numerals. The elements illustrated and their size ratios to one another should not in principle be regarded as being to scale, but rather individual elements such as, for example, layers, structures, components and zones, may have been made exaggeratedly thick or large to illustrate them better and/or to make them easier to understand.

FIG. 1A is a cross-sectional view of an example of a semiconductor chip 10. The semiconductor chip 10 comprises a substrate 1 on which a plurality of semiconductor layers are arranged. The semiconductor layers form a semiconductor layer stack 2 which comprises an active layer 2a that generates or receives electromagnetic radiation. The semiconductor chip 10 further comprises a radiation exit or entrance face 3 on which nanostructures 4 are arranged.

The semiconductor chip 10 emits or receives radiation. For example, the semiconductor chip 10 is an LED or a sensor.

The semiconductor layer stack 2 is based on the material system AlInGaN.

The substrate 1 of the semiconductor chip 10 is, for example, a growth substrate suitable for growing the semiconductor layers of the semiconductor layer stack 2. The substrate 1 may additionally be a carrier substrate. In this case the growth substrate is detached at least partially or preferably completely from the semiconductor layer stack 2 during the process of producing the semiconductor chip 10. Such a semiconductor chip 10 is also known as a thin film chip.

The substrate 1 may have a different lattice parameter and/or a different coefficient of expansion from the semiconductor layers of the semiconductor layer stack 2. This may result in dislocations and point defects, which may form non-emitting or non-receiving recombination centers, so reducing internal and external quantum efficiency. In addition, such defects may lead to a leakage current path in the semiconductor chip.

To counter these conventionally occurring disadvantages, a plurality of nanostructures 4 is arranged on the radiation exit face or radiation entrance face 3. The nanostructures 4 advantageously increase the surface area of the radiation exit face or radiation entrance face 3. In addition, by enlarging the surface area, it is possible to counter the negative effects of dislocations and point defects, wherein this property may advantageously also be independent of the surface on which the nanostructures are applied. The dislocation density may in particular be reduced significantly, whereby internal and external quantum efficiency may advantageously be increased.

To increase the surface area, substructures are additionally arranged in the nanostructures (not shown), which are explained in greater detail in connection with FIGS. 2 to 4.

As a result of the nanostructures with integral substructures, the proportion of the radiation emitted, for example, by the active layer 2a and reflected back into the semiconductor layer stack at the boundary surface between semiconductor layer stack 2 may advantageously be reduced due to the resultant change in the incident angle of the radiation such that the efficiency of the semiconductor chip is improved further.

In particular, at the boundary surface of the semiconductor chip 10 a jump takes place in the refractive indices from the material of the semiconductor chip 10 on the one hand to the surrounding material on the other hand. This results in refraction of the radiation at the point of transition from the semiconductor chip 10 to the surrounding environment. Depending on the angle at which a beam of light impinges on the boundary surface, total reflection may occur. As a result of the parallel surface of the semiconductor chip 10, the reflected beam of light impinges at the same angle on the opposing boundary surface such that total reflection also takes place there. The consequence is that the beam of light cannot therefore contribute to the light emission of the semiconductor chip 10. Because nanostructures 4 are provided on the radiation exit face, the angle is modified at which a beam of light impinges on the surface area, thereby advantageously increasing efficiency.

The nanostructures 4 are arranged in a periodic pattern on the radiation exit or radiation entrance face 3. Because of this periodic and uniform arrangement, angle-independent light emission advantageously takes place such that the semiconductor chip 10 exhibits a homogeneous emission pattern.

Alternatively, beam-shaping properties may be purposefully produced by the periodic arrangement of the nanostructures 4, without the radiation exit or entrance face 3 needing post-treatment steps.

The nanostructures 4 extend laterally by at most 5 μm and particularly preferably by at most 2 μm. The lateral extent of the nanostructures 4 in particular extends parallel to the radiation exit face or radiation entrance face 3 of the semiconductor chip 10.

A semiconductor chip 10 comprises nanostructures 4 on the radiation exit or entrance face 3 which are of minimal dimensions and arranged in a regular pattern, whereby dislocations and point defects in the semiconductor chip 10 may be countered, thereby advantageously increasing the efficiency of these semiconductor chips 10.

The nanostructures 4 are preferably three-dimensional structures. For example, the nanostructures 4 are pyramidal or rod-shaped. In addition, at least some of the nanostructures 4 comprise at least one substructure. One nanostructure 4 may comprise a plurality of substructures.

Figure 1B:
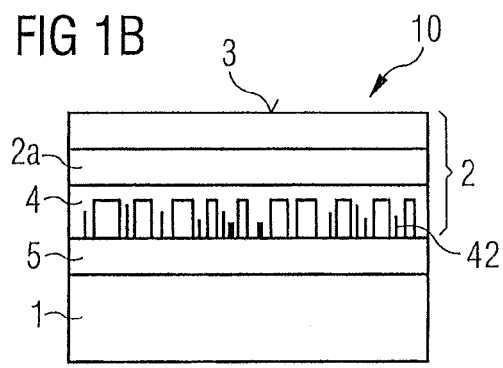

FIG. 1B shows a semiconductor chip 10 according to a further example which, compared to the previous example, comprises a plurality of nanostructures 4 in the semiconductor layer stack 2. The active layer 2a is here arranged between the nanostructures 4 and the radiation exit or entrance face 3.

The nanostructures 4 are grown on a buffer layer 5 of AlInGaN and extend laterally by at most 5 μm and particularly preferably by at most 2 μm.

The nanostructures 4 are columnar or rod-shaped, for example, with a hexagonal cross-section and at least in part comprise substructures 42 in the form of wells, in particular tubular wells. The nanostructures 4 exhibit different sizes and/or shapes. The nanostructures 4 with substructures 42 advantageously make it possible to reduce lattice defects in the active layer 2a.

The semiconductor chip 10 of FIG. 1B may exhibit further features which are described in relation to the example of FIG. 1A. In particular, the semiconductor chip 10 according to FIG. 1B may also comprise nanostructures 4 on the radiation exit or entrance face 3. Alternatively, the radiation exit or entrance face 3 may also, for example, be roughened.

Figure 1C:
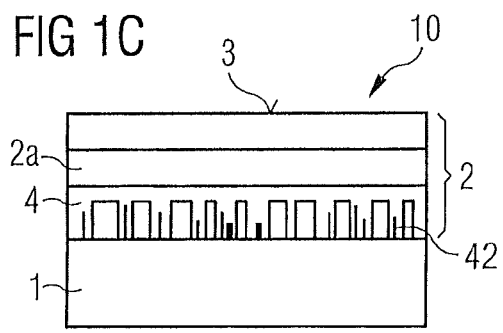

FIG. 1C shows a further example of a semiconductor chip 10 which, in contrast to the previous example, does not comprise a buffer layer. The nanostructures 4 with substructures 42 are grown directly on or applied directly to the substrate 1 during formation of the semiconductor layer stack 2.

Figure 1D:
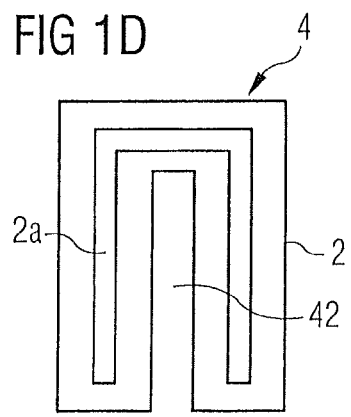
FIG. 1D is a schematic representation of a nanostructure according to a further example.

As an alternative to the examples shown in FIGS. 1B and 1C, the active layer 2a may also be arranged within the nanostructures 4. FIG. 1D shows an example of such a nanostructure 4. The semiconductor layer stack 2 in a semiconductor chip may exhibit a plurality of such nanostructures 4 of different sizes and/or shapes.

The nanostructure 4 is of rod-shaped construction and comprises a hexagonal cross-section, for example. Moreover, the nanostructure 4 comprises a substructure 42 in the form of a well or recess, by which the surface area of the nanostructure 4 is enlarged. This makes it possible for any lattice defects which may be present in the nanostructure 4 to extend over the enlarged surface area, the active layer 2a thus comprising a reduced defect density. Furthermore, the active layer 2a in the nanostructure 4 may be enlarged.

Further examples of nanostructures 4 are shown in FIGS. 2A to 4B. FIGS. 2A to 3A in particular show nanostructures 4 which may each be arranged with a bottom 43 on the radiation exit or entrance face 3 of the semiconductor chips 10 according to the examples of FIGS. 1A to 1C.

Figure 2A:
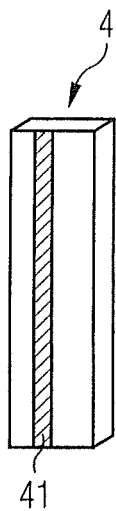
FIGS. 2A to 2C each show schematic views of a nanostructure in each case according to an example, wherein the nanostructure may, for example, be used in one of the semiconductor chips according to FIGS. 1A to 1C.

FIG. 2A shows a rod-shaped nanostructure 4 comprising a substructure 41. The substructure 41 takes the form of an elongate bulge or raised portion, which in the illustration shown projects out of the plane of the drawing. The bulge 41 extends along the rod-shaped nanostructure 4. The substructure 41 may in particular increase the surface area of the nanostructure, whereby the effects of the dislocations and point defects in the semiconductor chip may be countered.

The substructure 41 is then purposefully configured in accordance with the optoelectronic and chemical properties of the semiconductor layer stack 2. The substructure 41 does not absolutely have to extend over the entire height of the nanostructure 4. Instead, the substructure 41 may merely be provided in a portion of the nanostructure 4.

Rod-shaped nanostructures on the radiation exit or entrance face may, for example, be used in combination with semiconductor chips configured as sensors. In this case, the radiation entrance face of such a sensor comprises, as shown in FIG. 1, a plurality of such rod-shaped nanostructures 4, which are arranged in a regular pattern.

As an alternative, semiconductor chips in the form of LEDs may also comprise such rod-shaped nanostructures.

Such nanostructures may, for example, be produced using an MOCVD method. Post-treatment of the radiation exit and entrance face or of the nanostructures is then unnecessary. Using such an MOCVD method, it is in particular possible to produce nanostructures with integral substructures, which are of small dimensions, comprise virtually exact side faces and are arranged in a regular pattern, thereby advantageously improving the efficiency of such chips.

Alternatively, the nanostructures may also be produced using a self-organized growth process, for instance MBE, whereby irregular nanostructures are, for example, also obtainable.

Figure 2B:
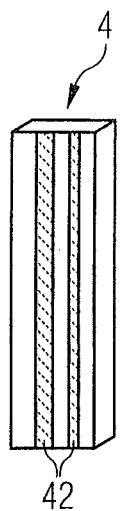

The nanostructure 4 shown in FIG. 2B does not comprise any raised portion as substructure, compared with the nanostructures of FIG. 2A. The substructure of FIG. 2B in particular takes the form of a recess 42 which projects into the plane of the drawing in the illustration shown. The nanostructure 4 comprises a plurality of substructures 42, in particular a plurality of recesses, which may exhibit different sizes and/or shapes. In particular, one of the substructures 42 is thinner than the others. The shape and size of the substructures are designed to correspond to the optoelectronic and chemical properties of the semiconductor layer stack.

By the way, the example of FIG. 2B may also comprise features of the example of FIG. 2A.

Figure 2C:
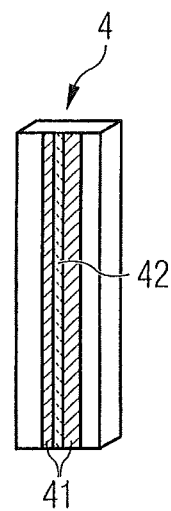

FIG. 2C shows a nanostructure 4 comprising a plurality of substructures 41, 42, wherein the substructures may take the form of raised portions 41 and recesses 42. In particular, a recess 42 is arranged between two raised portions 41. In this way, the surface area of the nanostructure 4 may advantageously be increased, which may have an advantageous effect on the efficiency of the semiconductor chips comprising such nanostructures.

By the way, the example of FIG. 2C may comprise features of the examples of FIGS. 2A and 2B.

Instead of the cubic shape or a columnar or rod shape with a quadrangular cross-section, the nanostructures of FIGS. 2A to 2C may in particular also exhibit a columnar or rod shape with a polygonal, in particular hexagonal, cross-section in a section plane perpendicular to the plane of the drawing, such that the substructures 41 and/or 42 are formed along the side faces of such nanostructures.

Figure 3A:
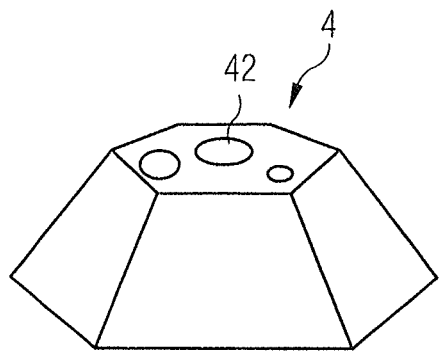
FIGS. 3A and 3B each show schematic views of a nanostructure according to a further example, wherein the nanostructure may, for example, be used in the semiconductor chip according to FIG. 1A.
Figure 3B:
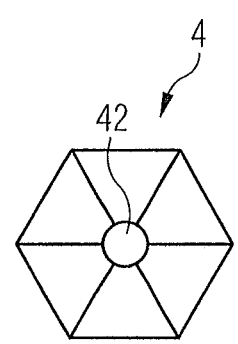

FIGS. 3A and 3B show further examples of nanostructures 4, as may be used, for example, in semiconductor chips of the example of FIG. 1.

The nanostructure 4 of FIG. 3A is pyramidal in form, its apex having been flattened in the example of FIG. 3A. The nanostructure 4 on the top and bottom is in particular hexagonal. Alternatively, the top and/or bottom may also comprise rounded corners or a round cross-section.

In the flattened region of the nanostructure 4, substructures configured as recesses 42 are formed. The substructures 42 may here be of different sizes and/or shapes. The substructures 42 advantageously increase the surface area of the nanostructure 4.

By producing the nanostructure 4 using an MOCVD method, virtually smooth side faces may advantageously be achieved. In addition, such nanostructures 4 extend laterally by at most 5 μm, preferably by at most 2 μm and particularly preferably by at most 1 μm. Such nanostructures 4 are arranged in a regular pattern on the radiation exit or entrance face of the semiconductor chip according to the example of FIG. 1 as shown, for example, in FIGS. 4A and 4B.

FIG. 3B shows a plan view of a nanostructure 4, which is of similar construction to the example of FIG. 3A. The nanostructure 4 takes the form of a hexagonal pyramid which comprises a substructure 42 in the center of the pyramid. The substructure 42 is in particular a recess. The pyramidal nanostructure 4 accordingly does not comprise an apex, the apex being replaced by a recess 42. This advantageously improves the radiation efficiency of a semiconductor chip which exhibits a regular pattern of such nanostructures 4 on its radiation entrance or exit face. This in particular provides the semiconductor chips with a homogeneous emission pattern.

Figure 4A:
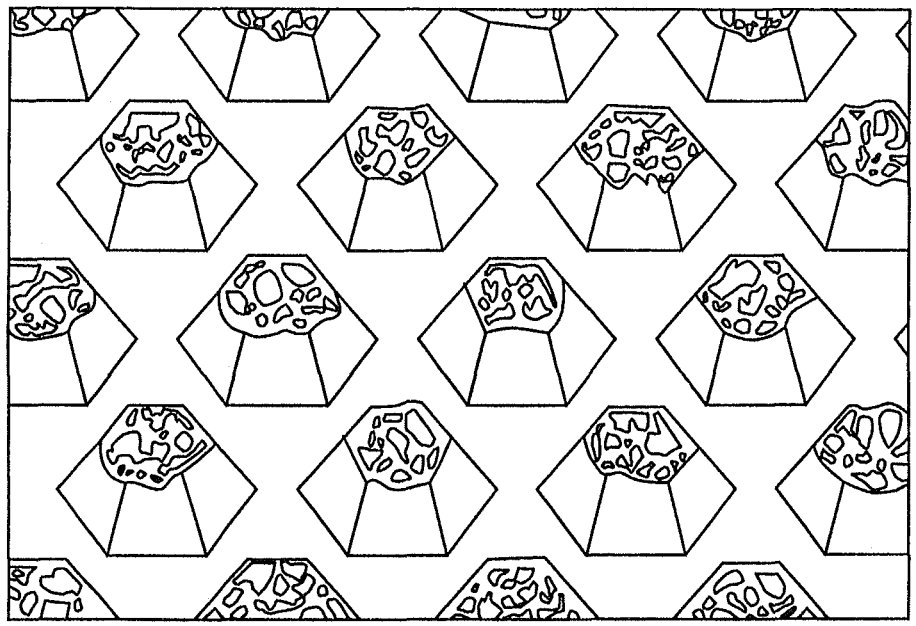
FIGS. 4A and 4B each show views of a radiation exit or entrance face of a semiconductor chip according to a further example.

FIG. 4A shows an oblique plan view of a radiation exit or entrance face of a semiconductor chip, as illustrated, for example, in FIG. 1. A plurality of nanostructures 4 is arranged on the radiation exit or radiation entrance face 3, these each being pyramidal in shape. In particular, the nanostructures 4 are hexagonal.

The pyramid apex of the nanostructures 4 has in each case been flattened. Substructures 42 are formed in the region of the flattened zones of the nanostructures 4. In particular, each nanostructure 4 comprises a plurality of different-sized substructures 42. In this example, the substructures take the form of recesses.

The nanostructures 4 of FIG. 4A are thus of similar construction to the example in FIG. 3A.

As shown in the example of FIG. 4A, the nanostructures 4 cover just some of the radiation exit or entrance face 3, the remainder of the radiation exit or entrance face 3 being free of nanostructures 4.

Figure 4B:
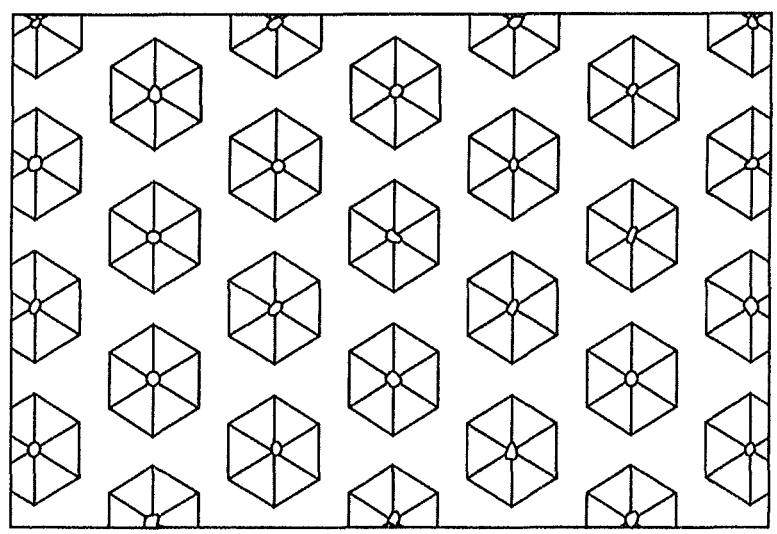

FIG. 4B shows a plan view of a radiation entrance face or exit face 3 of a semiconductor chip as shown, for example, in FIG. 1. A plurality of nanostructures 4 are formed in a regular pattern on the radiation exit or entrance face 3, the nanostructures being of pyramidal construction as in the example of FIG. 4A. They are in particular hexagonal in shape. In the region of the center of each pyramid, i.e., in the region of the apex, a substructure 42 is formed, which is in particular a recess.

The nanostructures 4 of FIG. 4B are thus of similar construction to the example in FIG. 3B.

The semiconductor chip or individual components thereof are not explicitly limited to the sizes indicated therefor in the figures. Rather, the disclosure additionally encompasses the sizes indicated in this description or the appended claims.

The description made with reference to examples does not restrict this disclosure. Rather, the disclosure encompasses any novel feature and any combination of features, including in particular any combination of features in the appended claims, even if the feature or combination is not itself explicitly indicated in the claims or examples.

The invention claimed is:

1. An optoelectronic semiconductor chip comprising:
    a semiconductor layer stack and a radiation exit or entrance face, wherein
    the semiconductor layer stack comprises an active layer that generates or receives electromagnetic radiation, and
    a plurality of nanostructures arranged in the semiconductor layer stack and/or on the radiation exit or entrance face, at least some of said nanostructures comprising at least one substructure,
    wherein 1) the nanostructures are of pyramidal construction and hexagonal in shape when seen in top view, 2) in a region of a center of each pyramid, and, hence, in the region of an apex, the substructure is formed as a recess, and 3) the nanostructures extend laterally by at most 5 μm.

2. The optoelectronic semiconductor chip according to claim 1, wherein the nanostructures are arranged in a periodic pattern.

3. The optoelectronic semiconductor chip according to claim 1, wherein the nanostructures comprise a plurality of substructures, which exhibit different sizes and/or shapes.

4. The optoelectronic semiconductor chip according to claim 1, wherein the nanostructures are three-dimensional structures.

5. The optoelectronic semiconductor chip according to claim 1, wherein the nanostructures are pyramidal and each comprise a plurality of different-sized substructures.

6. The optoelectronic semiconductor chip according to claim 1, wherein the active layer is arranged between the nanostructures and the radiation exit or entrance face.

7. The optoelectronic semiconductor chip according to claim 1, wherein the active layer is arranged in the nanostructures.

8. An optoelectronic semiconductor chip comprising:
    a semiconductor layer stack and a radiation exit face, wherein
    the semiconductor layer stack comprises an active layer that generates electromagnetic radiation,
    a plurality of nanostructures arranged on the radiation exit face, at least some of said nanostructures comprising at least one substructure,
    the nanostructures each extend laterally by at most 2 μm,
    the nanostructures are produced by metal organic vapor phase epitaxy, molecular beam epitaxy or liquid phase epitaxy, shape and size of the nanostructures and substructures being established by said method,
    the substructures comprise vertical flanks,
    the nanostructures are pyramidal and of hexagonal shape, seen in top view. the substructure is formed in a region of a center of each pyramid and, thus, in the region of an apex, and
    the substructure is formed as a recess of circular shape, seen in top view.

9. A method of producing an optoelectronic semiconductor chip comprising:
    forming a semiconductor layer stack comprising an active layer that generates or receives electromagnetic radiation,
    forming nanostructures on the semiconductor layer stack or in the semiconductor layer stack, and
    forming at least one substructure in at least some of the nanostructures. wherein the nanostructures are produced by metal organic vapor phase epitaxy molecular beam epitaxy or liquid phase epitaxy, shape and size of the nanostructures and of the substructures being established directly by said method, and wherein the nanostructures extend laterally by at most 5 µm.

10. The method according to claim 9, wherein a surface area of the nano-structure is enlarged by the substructure.

11. The method according to claim 9, wherein a growth substrate, on which the semiconductor layer stack has been grown, is at least partially or completely detached.

12. The method according to claim 9, wherein the nanostructures are of pyramidal construction and hexagonal in shape when seen in top view.

* * * * *